US008835301B2

(12) United States Patent
Choi et al.

(10) Patent No.: US 8,835,301 B2
(45) Date of Patent: Sep. 16, 2014

(54) SEMICONDUCTOR DEVICE AND METHOD OF FORMING BUMP STRUCTURE WITH INSULATING BUFFER LAYER TO REDUCE STRESS ON SEMICONDUCTOR WAFER

(75) Inventors: JoonYoung Choi, Kyoung-ki-do (KR); YoungJoon Kim, Kyoungki-do (KR); SungWon Cho, Kyoung-gi-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 843 days.

(21) Appl. No.: 13/037,181

(22) Filed: Feb. 28, 2011

(65) Prior Publication Data

US 2012/0217640 A1 Aug. 30, 2012

(51) Int. Cl.
*H01L 23/48* (2006.01)
*H01L 23/00* (2006.01)

(52) U.S. Cl.
CPC .......... *H01L 24/03* (2013.01); *H01L 2224/1145* (2013.01); *H01L 2224/05073* (2013.01);
(Continued)

(58) Field of Classification Search
USPC ........................... 257/737, E23.068; 438/613
See application file for complete search history.

(56) References Cited

U.S. PATENT DOCUMENTS

6,630,736 B1 10/2003 Ignaut
6,649,533 B1 11/2003 Iacoponi
(Continued)

*Primary Examiner* — S. V. Clark
*Assistant Examiner* — Krista Soderholm
(74) *Attorney, Agent, or Firm* — Robert D. Atkins; Patent Law Group: Atkins and Associates, P.C.

(57) ABSTRACT

A semiconductor wafer has a plurality of semiconductor die with contact pads for electrical interconnect. An insulating layer is formed over the semiconductor wafer. A bump structure is formed over the contact pads. The bump structure has a buffer layer formed over the insulating layer and contact pad. A portion of the buffer layer is removed to expose the contact pad and an outer portion of the insulating layer. A UBM layer is formed over the buffer layer and contact pad. The UBM layer follows a contour of the buffer layer and contact pad. A ring-shaped conductive pillar is formed over the UBM layer using a patterned photoresist layer filled with electrically conductive material. A conductive barrier layer is formed over the ring-shaped conductive pillar. A bump is formed over the conductive barrier layer. The buffer layer reduces thermal and mechanical stress on the bump and contact pad.

25 Claims, 9 Drawing Sheets (52) U.S. Cl.
CPC .......... H01L2224/13007 (2013.01); *H01L 2224/05111* (2013.01); *H01L 2224/13647* (2013.01); *H01L 2224/16238* (2013.01); *H01L 2224/05624* (2013.01); H01L 24/05 (2013.01); *H01L 2224/05011* (2013.01); *H01L 2924/01029* (2013.01); *H01L 2224/1146* (2013.01); *H01L 2224/03452* (2013.01); *H01L 2224/05611* (2013.01); *H01L 2924/00013* (2013.01); *H01L 2224/136* (2013.01); *H01L 2224/05644* (2013.01); *H01L 2224/05027* (2013.01); *H01L 2224/13655* (2013.01); *H01L 2224/10126* (2013.01); *H01L 2224/05558* (2013.01); *H01L 2224/05018* (2013.01); *H01L 2224/05144* (2013.01); *H01L 2224/13613* (2013.01); *H01L 2224/05139* (2013.01); *H01L 2924/01322* (2013.01); *H01L 2224/03903* (2013.01); H01L 24/13 (2013.01); *H01L 2224/05655* (2013.01); *H01L 2224/81191* (2013.01); *H01L 2224/05566* (2013.01); *H01L 2224/0508* (2013.01); *H01L 24/16* (2013.01); H01L 24/11 (2013.01); *H01L 2224/13616* (2013.01); *H01L 2224/1147* (2013.01); *H01L 2224/13022* (2013.01); *H01L 2224/13624* (2013.01); *H01L 2224/13639* (2013.01); *H01L 2224/05647* (2013.01); *H01L 2224/0345* (2013.01); *H01L 2224/05155* (2013.01); *H01L 2224/05573* (2013.01); *H01L 2224/0401* (2013.01); *H01L 2224/13644* (2013.01); *H01L 2224/05147* (2013.01); *H01L 2224/0346* (2013.01); *H01L 2224/05124* (2013.01); *H01L 2224/13611* (2013.01); *H01L 2924/13901* (2013.01); *H01L 2224/05639* (2013.01); *H01L 2224/05572* (2013.01); *H01L 2224/02126* (2013.01); *H01L 2224/11849* (2013.01)
USPC .......... 438/613; 257/E23.068; 257/737

(56) References Cited

U.S. PATENT DOCUMENTS

| | | | |
|---|---|---|---|
| 7,449,785 | B2 | 11/2008 | Jeng et al. |
| 8,173,536 | B2 | 5/2012 | Cho et al. |
| 2004/0094837 | A1 | 5/2004 | Greer |
| 2004/0157450 | A1 | 8/2004 | Bojkov et al. |
| 2005/0017376 | A1 | 1/2005 | Tsai |
| 2008/0197490 | A1 | 8/2008 | Chyi |
| 2009/0189286 | A1 | 7/2009 | Daubenspeck et al. |
| 2010/0155943 | A1* | 6/2010 | Carey et al. .......... 257/737 |
| 2012/0061823 | A1* | 3/2012 | Wu et al. .......... 257/737 |

* cited by examiner

SEMICONDUCTOR DEVICE AND METHOD OF FORMING BUMP STRUCTURE WITH INSULATING BUFFER LAYER TO REDUCE STRESS ON SEMICONDUCTOR WAFER

FIELD OF THE INVENTION

The present invention relates in general to semiconductor devices and, more particularly, to a semiconductor device and method of forming a bump structure with an insulating buffer layer to reduce thermal and mechanical stress on a semiconductor wafer.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

Flipchip type semiconductor die often contain contact pads with UBM and bumps for electrical interconnect to other devices. The bumps and contact pads are subject to thermal and mechanical stress, particularly for fine pitch bumps on low dielectric constant (k) semiconductor wafers. The stress can cause bump cracking, delamination, and other interconnect defects, particularly during manufacturing and reliability testing. The thermal and mechanical stress decreases in production yield and increases manufacturing costs.

SUMMARY OF THE INVENTION

A need exists to reduce stress on the contact pads and bumps used for electrical interconnect in semiconductor die. Accordingly, in one embodiment, the present invention is a method of making a semiconductor device comprising the steps of providing a semiconductor wafer having a contact pad, forming an insulating layer over the semiconductor wafer, forming a buffer layer over the insulating layer and contact pad, removing a portion of the buffer layer to expose the contact pad, and forming a first conductive layer over the buffer layer and contact pad. The first conductive layer is electrically connected to the contact pad. The method further includes the steps of forming a ring-shaped conductive pillar over the first conductive layer, forming a second conductive layer over the ring-shaped conductive pillar, and forming a bump over the second conductive layer.

In another embodiment, the present invention is a method of making a semiconductor device comprising the steps of providing a semiconductor die having a contact pad, forming an insulating layer over the semiconductor die, forming a buffer layer over the insulating layer and contact pad, forming a first conductive layer over the buffer layer and contact pad, forming a conductive pillar over the first conductive layer, forming a second conductive layer over the conductive pillar, and forming an electrical interconnect over the second conductive layer.

In another embodiment, the present invention is a method of making a semiconductor device comprising the steps of providing a semiconductor die having a contact pad, forming a buffer layer over the semiconductor die and contact pad, forming a first conductive layer over the buffer layer and contact pad, forming a conductive pillar over the first conductive layer, and forming an electrical interconnect over the conductive pillar and first conductive layer.

In another embodiment, the present invention is a semiconductor device comprising a semiconductor die having a contact pad. An insulating layer is disposed over the semiconductor die. A buffer layer is disposed over the insulating layer and contact pad. A first conductive layer is disposed over the buffer layer and contact pad. A conductive pillar is disposed over the first conductive layer. An electrical interconnect is disposed over the second conductive layer.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
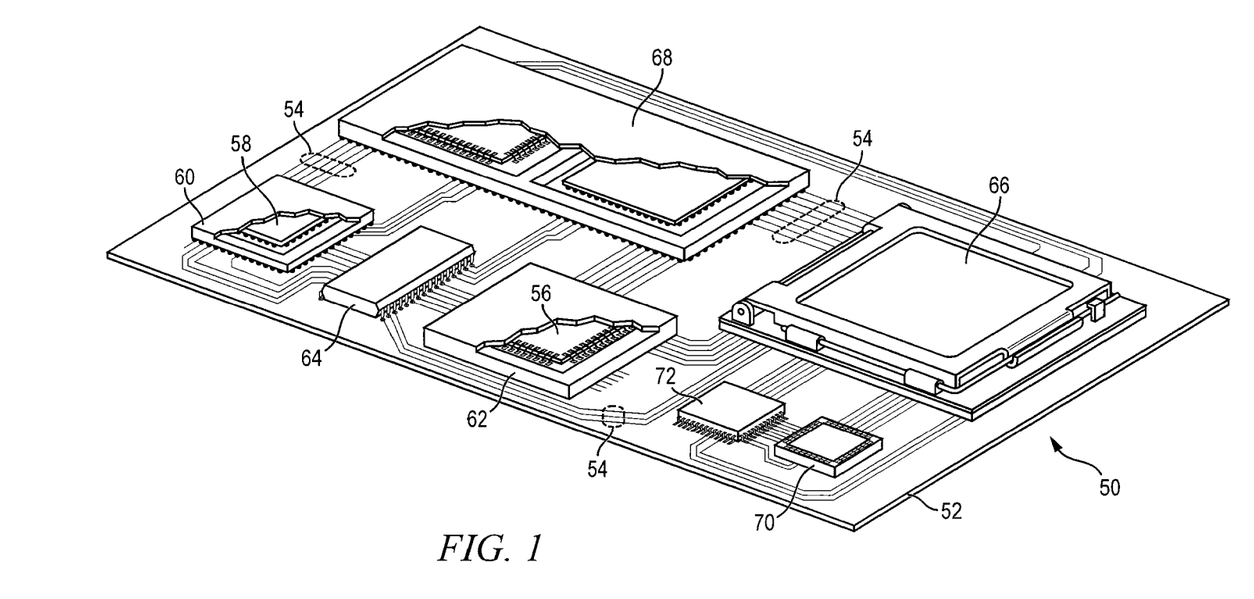
FIG. 1 illustrates a printed circuit board (PCB) with different types of packages mounted to its surface.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
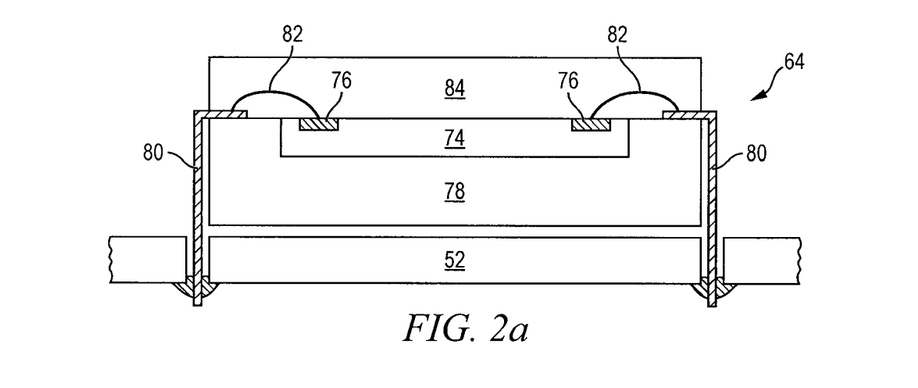
FIGS. 2a-2c illustrate further detail of the representative semiconductor packages mounted to the PCB.

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

Figure 2B:
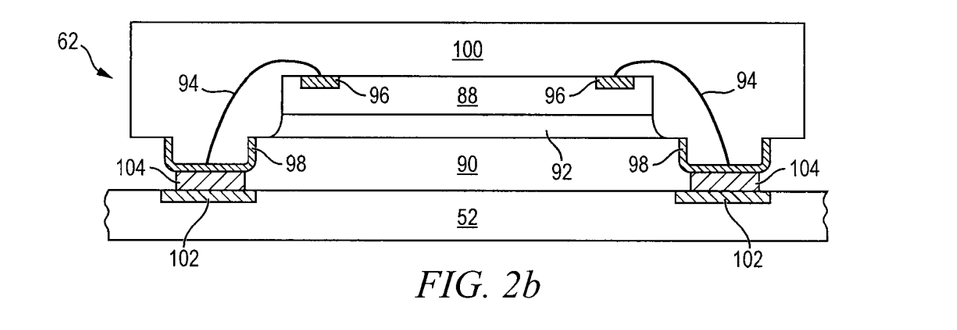

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

Figure 2C:
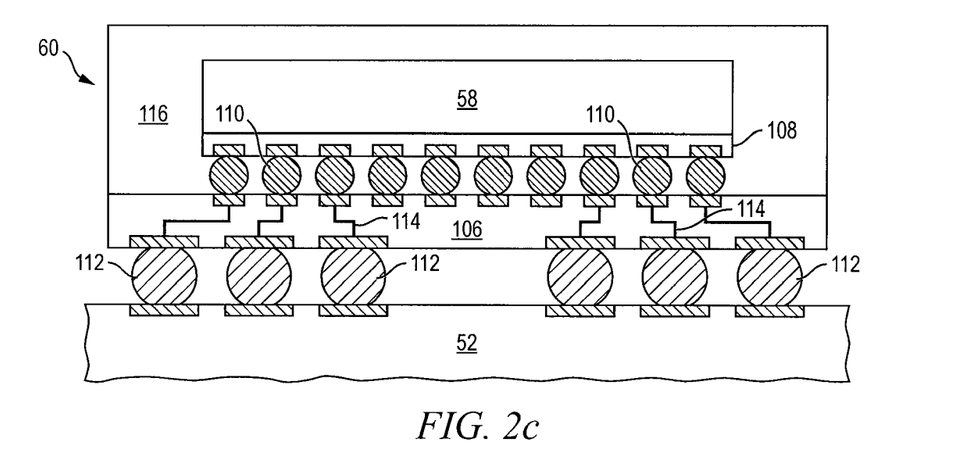

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
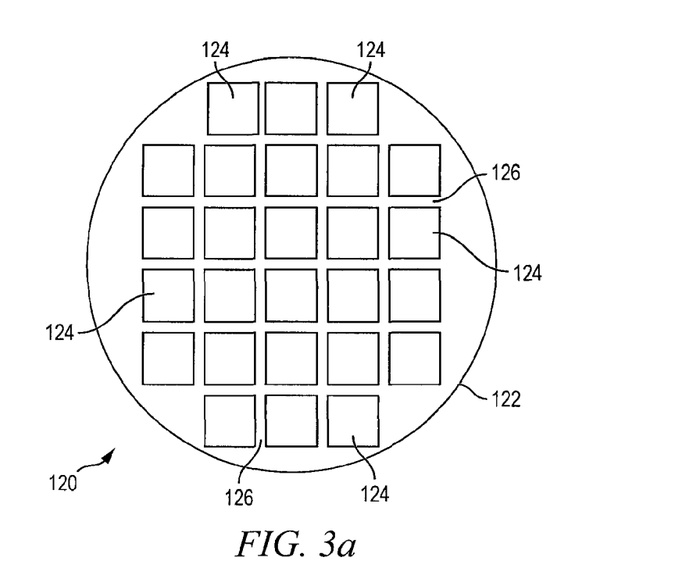
FIGS. 3a-3n illustrate a process of forming a bump structure with an insulating buffer layer to reduce stress on a semiconductor wafer.
Figure 3B:
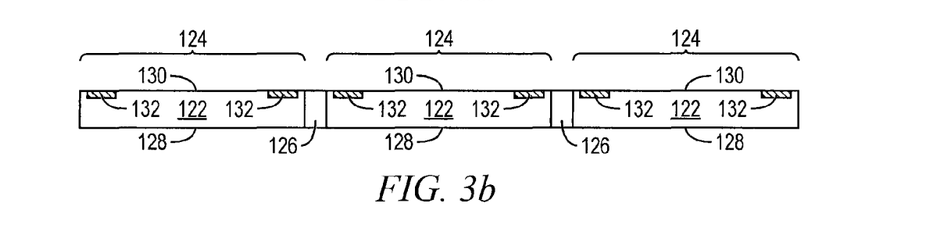
Figure 3C:
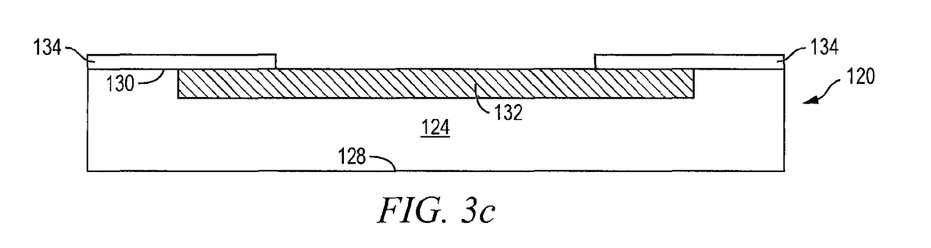
Figure 3D:
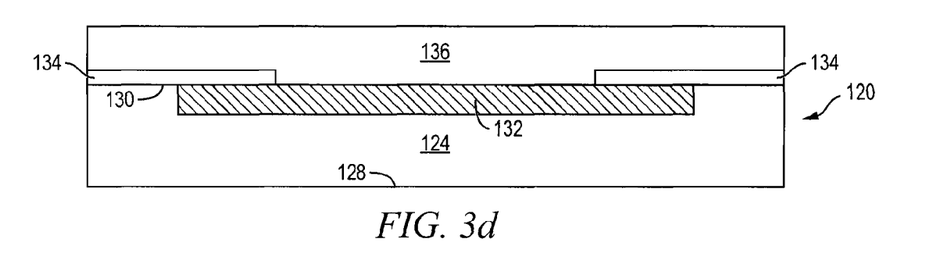
Figure 3E:
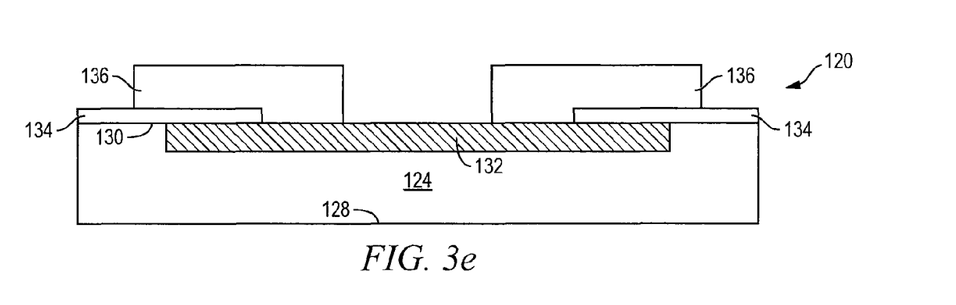
Figure 3F:
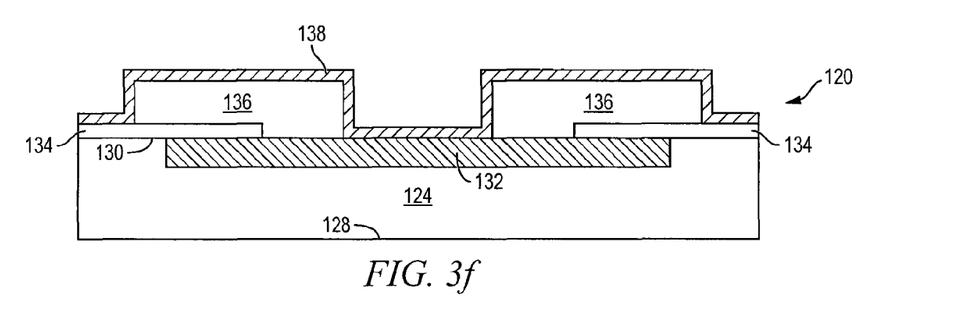
Figure 3G:
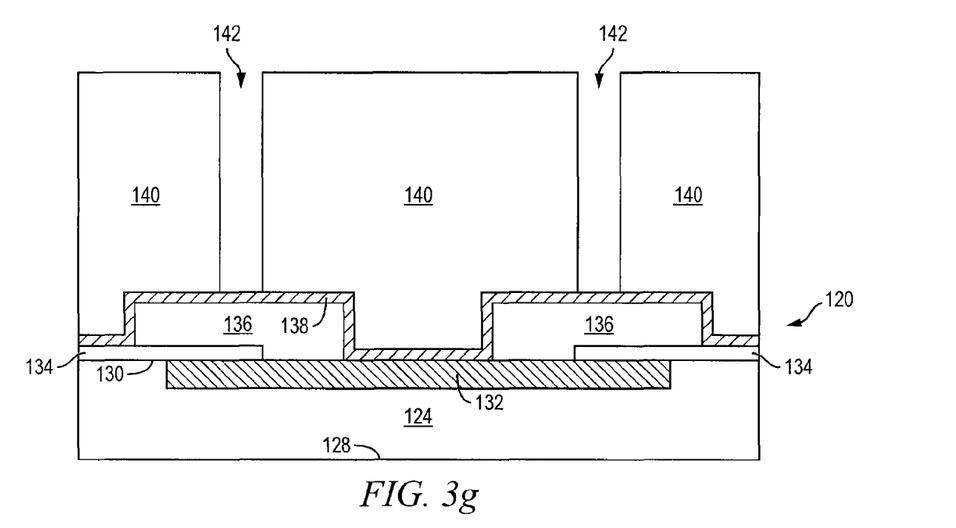
Figure 3H:
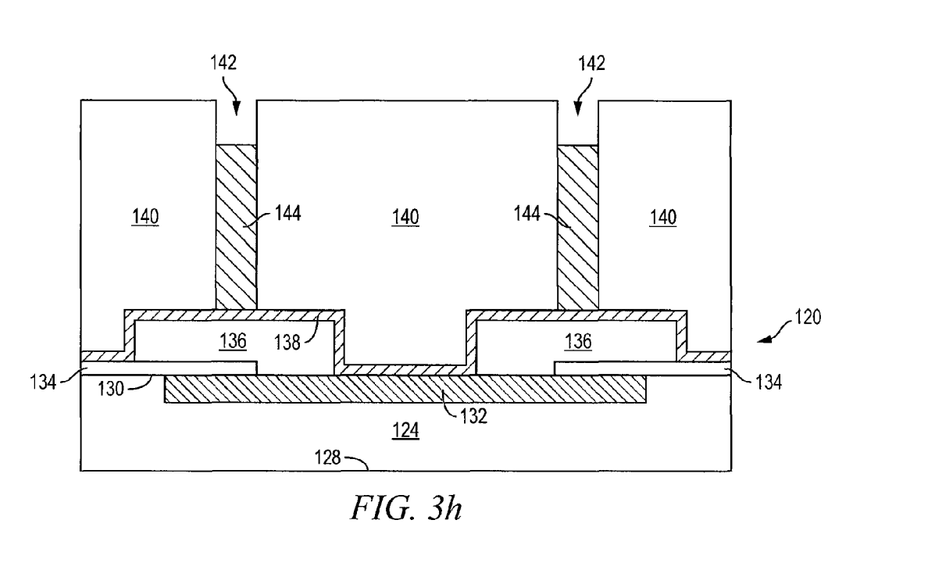
Figure 3I:
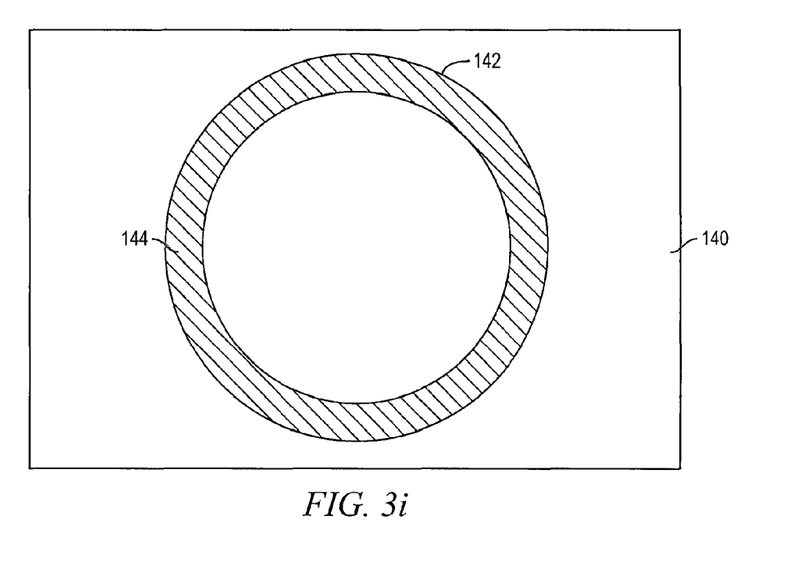
Figure 3J:
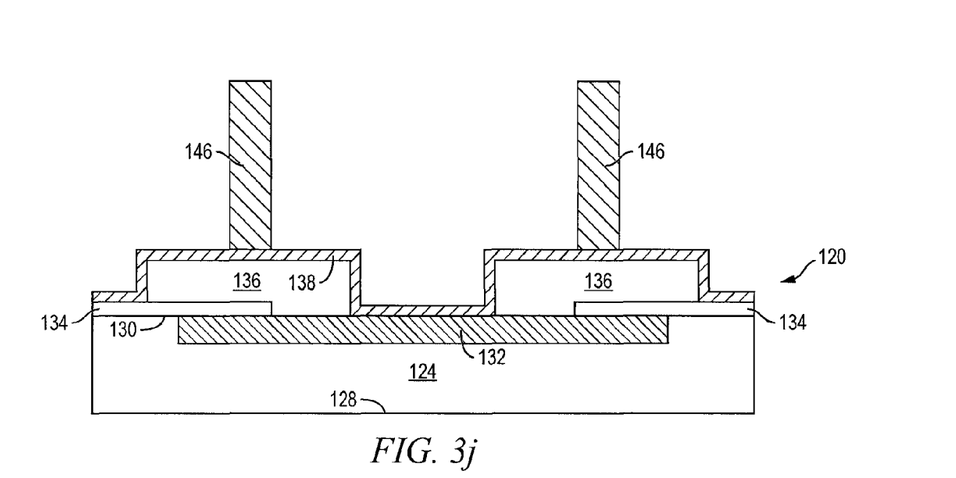
Figure 3K:
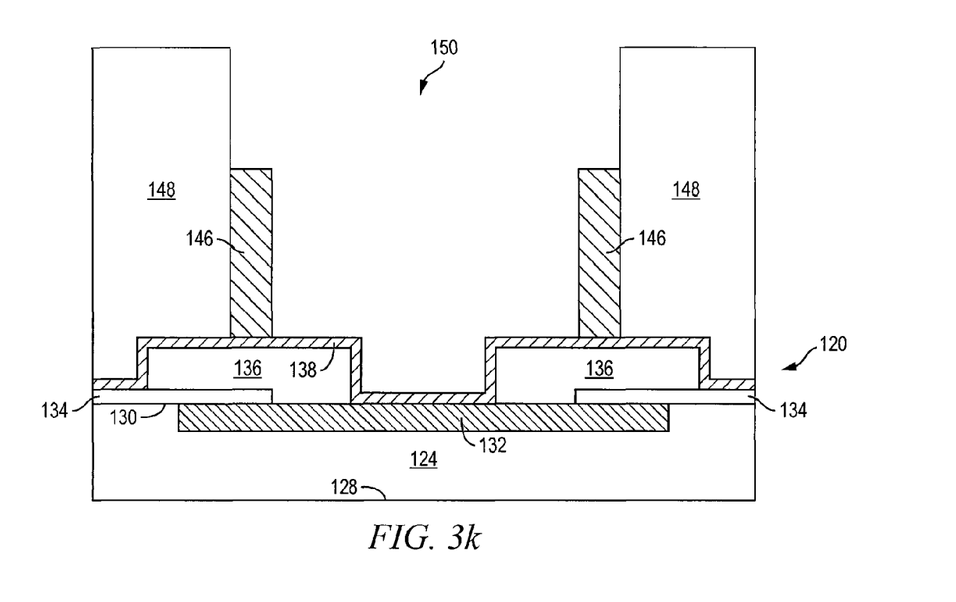
Figure 3L:
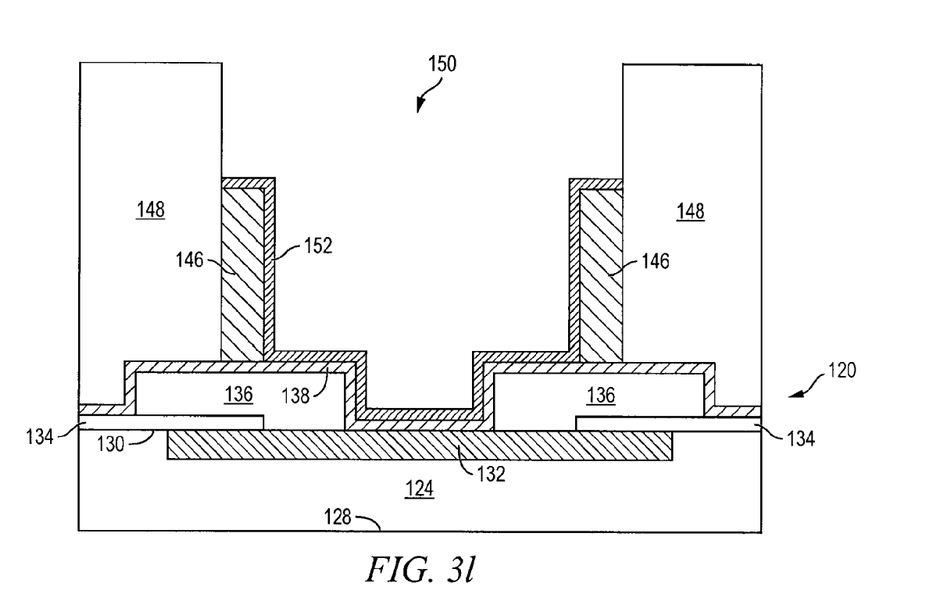
Figure 3M:
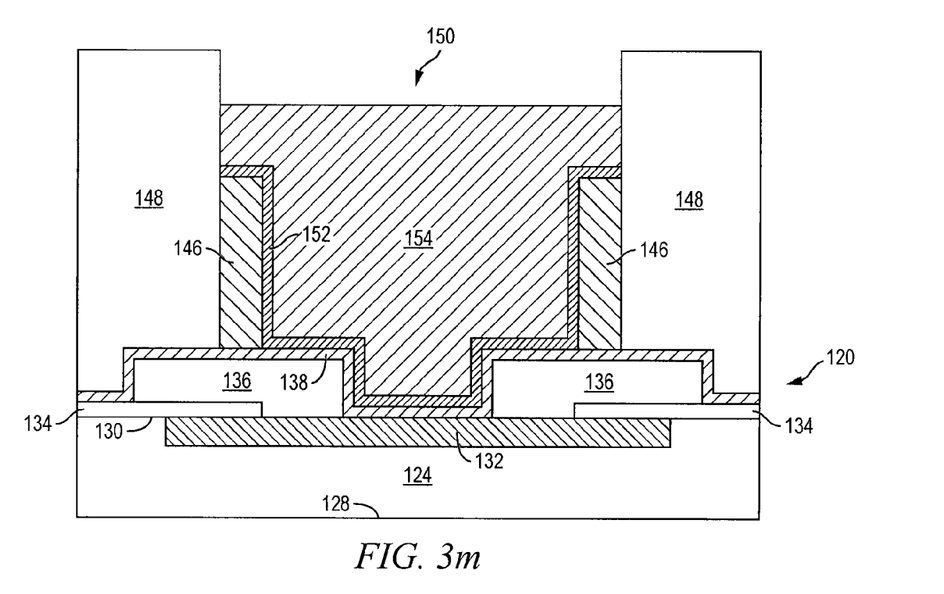
Figure 3N:
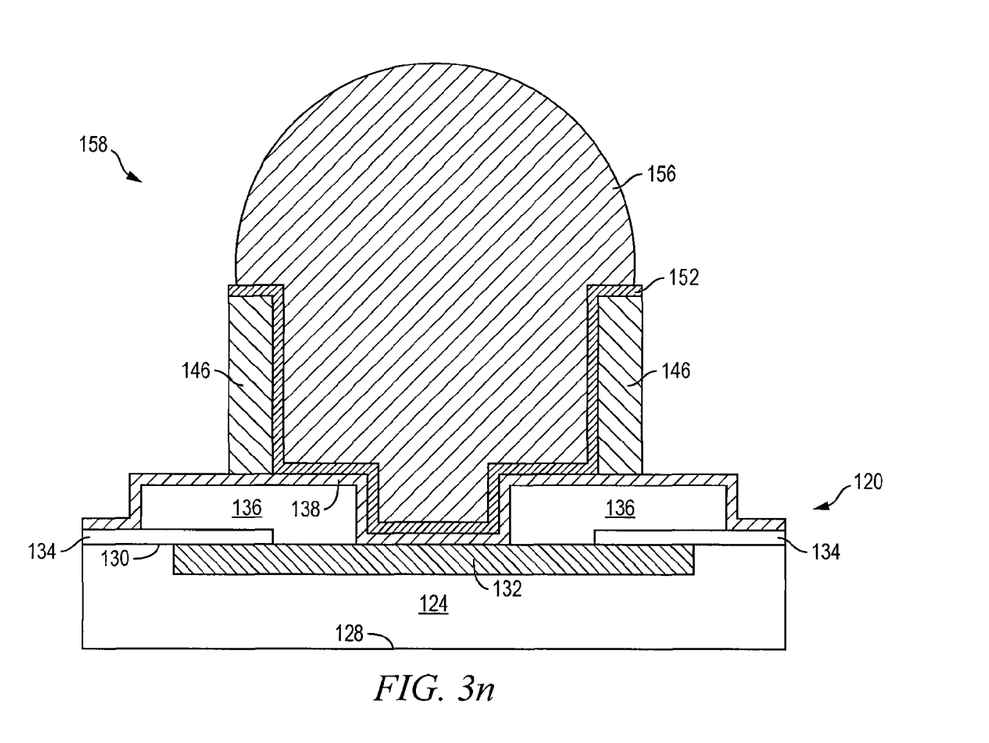

FIGS. 3a-3n illustrate, in relation to FIGS. 1 and 2a-2c, a process of forming a bump structure with an insulating buffer layer to reduce thermal and mechanical stress on a semiconductor wafer. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124. In one embodiment, semiconductor die 124 may have dimensions ranging from 2×2 millimeters (mm) to 15×15 mm.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads are disposed a first distance from the edge of the die, and a second row of contact pads alternating with the first row are disposed a second distance from the edge of the die.

FIG. 3c shows a portion of semiconductor wafer 120 associated with a single contact pad 132. An insulating or passivation layer 134 is formed over active surface 130 and conductive layer 132 using PVD, CVD, printing, spin coating, spray coating, lamination, or thermal oxidation. The insulating layer 134 can be one or more layers of silicon dioxide (SiO2), silicon nitride (Si3N4), silicon oxynitride (SiON), tantalum pentoxide (Ta2O5), aluminum oxide (Al2O3), or other suitable material with similar insulating and structural properties. A portion of insulating layer 134 is removed by an etching process to expose conductive layer 132.

In FIG. 3d, an insulating buffer layer 136 is formed over insulating layer 134 and the exposed conductive layer 132 using PVD, CVD, printing, spin coating, spray coating, lamination, or thermal oxidation. The insulating buffer layer 136 contains one or more layers of polyimide, benzocyclobutene (BCB), polybenzoxazoles (PBO), SiO2, Si3N4, SiON, Ta2O5, Al2O3, or other suitable dielectric material. The insulating buffer layer 136 follows the contour of conductive layer 132 and insulating layer 134. In FIG. 3e, a portion of insulating buffer layer 136 is removed by an etching process to expose conductive layer 132 and an outer portion of insulating layer 134 away from the contact pad. The insulating buffer layer 136 remains in the vicinity of contact pad 132.

In FIG. 3f, an electrically conductive layer 138 is conformally applied over insulating buffer layer 136 and the exposed conductive layer 132 using a patterning and metal deposition process such as PVD, CVD, sputtering, electrolytic plating, and electroless plating. Conductive layer 138 can be one or more layers of Al, Cu, Sn, Ni, Au, Ag, or other suitable electrically conductive material. Conductive layer 138 follows the contour of insulating buffer layer 136 and the exposed conductive layer 132. Conductive layer 138 operates as an under bump metallization (UBM) layer electrically connected to conductive layer 132.

In FIG. 3g, a photoresist layer 140 is deposited over semiconductor wafer 120 to a thickness of 50-60 micrometers (μm). A portion of photoresist layer 140 is removed by patterning and etching to form circular or ring-shaped opening 142 and expose conductive layer 138.

In FIG. 3h, an electrically conductive material 144 is deposited within ring-shaped opening 142 using electrolytic plating or electroless plating. Conductive layer 146 can be one or more layers of Al, Cu, Sn, Ni, Au, Ag, or other suitable electrically conductive material. FIG. 3i shows a top view of electrically conductive material 144 within ring-shaped opening 142 in photoresist layer 140.

In FIG. 3j, photoresist layer 140 is removed by an etching process leaving ring-shaped conductive pillar 146 electrically connected to conductive layer 138. In one embodiment, circular conductive pillar 146 has a height of 30-40 μm.

In FIG. 3k, a photoresist layer 148 is deposited over semiconductor wafer 120 using spin coating to completely cover ring-shaped conductive pillar 146. A portion of photoresist layer 148 is removed by patterning and etching to form opening 150 and expose ring-shaped conductive pillar 146 and conductive layer 138.

In FIG. 3l, an electrically conductive layer 152 is conformally applied over ring-shaped conductive pillar 146 and conductive layer 138 using a patterning and metal deposition process such as electrolytic plating and electroless plating. Conductive layer 152 can be one or more layers of Al, Cu, Sn, Ni, Au, Ag, or other suitable electrically conductive material. Conductive layer 152 follows the contour of ring-shaped conductive pillar 146 and conductive layer 138. Conductive layer 152 operates as a barrier layer electrically connected to ring-shaped conductive pillar 146 and conductive layer 138. The barrier layer 152 inhibits the diffusion of Cu into active surface 130 of semiconductor die 124.

In FIG. 3m, an electrically conductive bump material 154 is deposited over conductive layer 152 within opening 150 using an evaporation, electrolytic plating, electroless plating, ball drop, or screen printing process. Bump material 154 can be Al, Sn, Ni, Au, Ag, Pb, Bi, Cu, solder, and combinations thereof, with an optional flux solution. For example, bump material 154 can be eutectic Sn/Pb, high-lead solder, or lead-free solder. Bump material 154 is bonded to conductive layer 152 using a suitable attachment or bonding process. In one embodiment, bump material 154 is reflowed by heating the material above its melting point to form spherical balls or bumps 156. In some applications, bumps 156 are reflowed a second time to improve electrical contact to conductive layer 148. The bumps can also be compression bonded to conductive layer 148. Photoresist layer 150 is removed by leaving bump 156, as shown in FIG. 3n. Bumps 156 represent one type of interconnect structure that can be formed over conductive layer 148. The interconnect structure can also use stud bump, micro bump, or other electrical interconnect.

Figure 4A:
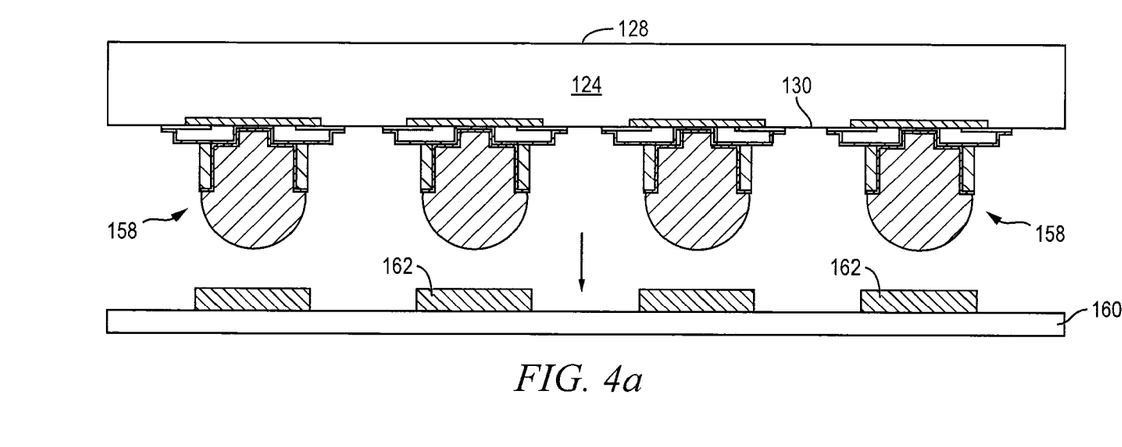
FIGS. 4a-4b illustrate the semiconductor die with the bump structure mounted to a substrate.
Figure 4B:
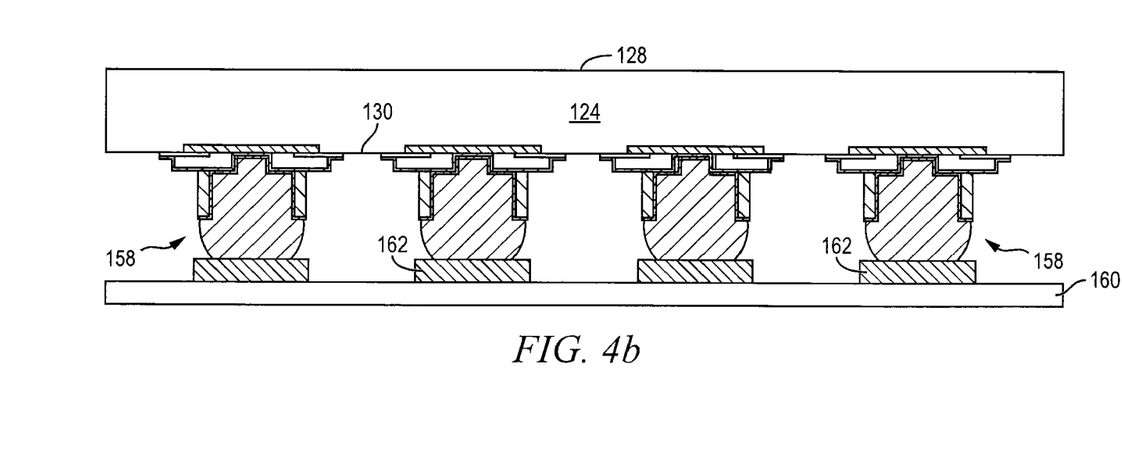

In FIGS. 4a-4b, semiconductor die 124 with a plurality of bump structures 158 from FIGS. 3a-3n formed over contact pads 132 is mounted to PCB or substrate 160. Bump structures 158 are electrically connected to bond pads or conductive traces 162 on substrate 160. The insulating buffer layer 136 in bump structure 158 reduces thermal and mechanical stress and warpage. The stress relief is particularly useful for fine pitch bumps on low-k semiconductor wafers. The insulating buffer layer 136 decreases bump cracking, delamination, and other interconnect defects, particularly during manufacturing and reliability testing, and increases production yield, which lowers manufacturing costs.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer having a contact pad;
   forming an insulating layer over the semiconductor wafer;
   forming a buffer layer over the insulating layer and contact pad;
   removing a portion of the buffer layer to expose the contact pad;
   forming a first conductive layer over the buffer layer and contact pad, the first conductive layer being electrically connected to the contact pad;
   forming a ring-shaped conductive pillar over the first conductive layer;
   forming a second conductive layer over the ring-shaped conductive pillar; and
   forming a bump over the second conductive layer.

2. The method of claim 1, wherein the buffer layer reduces stress on the bump and contact pad.

3. The method of claim 1, wherein forming the ring-shaped conductive pillar includes:

forming a photoresist layer over the first conductive layer;
removing a portion of the photoresist layer to create a ring-shaped opening and expose the first conductive layer;
depositing an electrically conductive material in the ring-shaped opening over the first conductive layer; and
removing the photoresist layer.

4. The method of claim 1, wherein forming the bump includes:
forming a photoresist layer over the first conductive layer;
removing a portion of the photoresist layer to expose the first conductive layer and ring-shaped conductive pillar;
depositing bump material over the first conductive layer and ring-shaped conductive pillar; and
reflowing the bump material to form the bump.

5. The method of claim 1, wherein the first conductive layer follows a contour of the buffer layer and contact pad.

6. The method of claim 1, wherein the first conductive layer is an under bump metallization layer and the second conductive layer is a barrier layer.

7. A method of making a semiconductor device, comprising:
providing a semiconductor die having a contact pad;
forming an insulating layer over the semiconductor die;
forming a buffer layer over the insulating layer and contact pad;
forming a first conductive layer over the buffer layer and contact pad;
forming a conductive pillar over the first conductive layer;
forming a second conductive layer over the conductive pillar; and
forming an electrical interconnect over the second conductive layer.

8. The method of claim 7, wherein the buffer layer reduces stress on the electrical interconnect and contact pad.

9. The method of claim 7, wherein the conductive pillar has a ring shape.

10. The method of claim 7, wherein the electrical interconnect includes a bump.

11. The method of claim 7, wherein forming the conductive pillar includes:
forming a photoresist layer over the first conductive layer;
removing a portion of the photoresist layer to expose the first conductive layer;
depositing an electrically conductive material over the first conductive layer; and
removing the photoresist layer.

12. The method of claim 7, wherein forming the bump includes:
forming a photoresist layer over the first conductive layer;
removing a portion of the photoresist layer to expose the first conductive layer and conductive pillar;
depositing bump material over the first conductive layer and conductive pillar; and
reflowing the bump material to form the bump.

13. The method of claim 7, wherein the first conductive layer follows a contour of the buffer layer and contact pad.

14. A method of making a semiconductor device, comprising:
providing a semiconductor die having a contact pad;
forming a buffer layer over the semiconductor die and contact pad;
forming a first conductive layer over the buffer layer and contact pad;
forming a conductive pillar over the first conductive layer; and
forming an electrical interconnect over the conductive pillar and first conductive layer.

15. The method of claim 14, further including forming an insulating layer over the semiconductor die prior to forming the buffer layer.

16. The method of claim 14, further including forming a second conductive layer over the conductive pillar.

17. The method of claim 14, wherein the buffer layer reduces stress on the electrical interconnect and contact pad.

18. The method of claim 14, wherein the conductive pillar has a ring shape.

19. The method of claim 14, wherein forming the conductive pillar includes:
forming a photoresist layer over the first conductive layer;
removing a portion of the photoresist layer to expose the first conductive layer;
depositing an electrically conductive material over the first conductive layer; and
removing the photoresist layer.

20. The method of claim 14, wherein forming the bump includes:
forming a photoresist layer over the first conductive layer;
removing a portion of the photoresist layer to expose the first conductive layer and conductive pillar;
depositing bump material over the first conductive layer and conductive pillar; and
reflowing the bump material to form the bump.

21. A semiconductor device, comprising:
a semiconductor die having a contact pad;
an insulating layer disposed over the semiconductor die;
a buffer layer disposed over the insulating layer and contact pad;
a first conductive layer disposed over the buffer layer and contact pad;
a conductive pillar disposed over the first conductive layer; and
an electrical interconnect disposed over the second conductive layer.

22. The semiconductor device of claim 21, wherein the buffer layer reduces stress on the electrical interconnect and contact pad.

23. The semiconductor device of claim 21, wherein the conductive pillar has a ring shape.

24. The semiconductor device of claim 21, further including a second conductive layer disposed over the conductive pillar.

25. The semiconductor device of claim 21, wherein the first conductive layer follows a contour of the buffer layer and contact pad.

* * * * *